(12) United States Patent
Kim

(10) Patent No.: US 6,252,809 B1
(45) Date of Patent: Jun. 26, 2001

(54) SEMICONDUCTOR MEMORY DEVICE CAPABLE OF EASILY DETERMINING LOCATIONS OF DEFECTIVE MEMORY CELLS BY SELECTIVELY ISOLATING AND TESTING REDUNDANCY MEMORY CELL BLOCK

(75) Inventor: Keum-yong Kim, Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 3 days.

(21) Appl. No.: 09/606,549

(22) Filed: Jun. 29, 2000

(30) Foreign Application Priority Data

Jul. 1, 1999 (KR) .................................................. 99-26349

(51) Int. Cl.⁷ ........................................................ G11C 7/00

(52) U.S. Cl. ............................................. 365/200; 365/201

(58) Field of Search .................................... 365/200, 201, 365/230.06

(56) References Cited

U.S. PATENT DOCUMENTS 5,999,480 * 12/1999 Ong e tal. ....................... 365/230.06

* cited by examiner

Primary Examiner—David Nelms
Assistant Examiner—M. Tran
(74) Attorney, Agent, or Firm—Myers Bigel Sibley & Sajovec

(57) ABSTRACT

A semiconductor memory device capable of easily determining where defective memory cells are located by selectively isolating and testing a redundancy memory cell block. In the semiconductor memory device having a redundancy memory cell block for replacing defective cells by redundant memory cells in order to repair the defective cells in a main memory cell block, a normal mode test for testing the main memory cell block and the redundancy memory cell block and a redundancy isolation mode test for selectively isolating and testing the redundancy memory cell block are adopted, and it is determined whether the defective memory cells found by the normal mode test are located in the main memory block or in the redundancy memory cell block by the redundancy isolation mode test.

10 Claims, 7 Drawing Sheets

SEMICONDUCTOR MEMORY DEVICE CAPABLE OF EASILY DETERMINING LOCATIONS OF DEFECTIVE MEMORY CELLS BY SELECTIVELY ISOLATING AND TESTING REDUNDANCY MEMORY CELL BLOCK

BACKGROUND OF THE INVENTION

1. Field of the Invention

The present invention relates to a semiconductor memory device, and more particularly, to a semiconductor memory device capable of easily determining the locations of defective memory cells by selectively isolating and testing a redundancy block.

2. Description of the Related Art

The speed and the degree of integration of semiconductor devices have recently increased as a technology of forming fine patterns has developed. In particular, high yield as well as high integration is required for semiconductor memory devices.

Semiconductor memory devices consist of a plurality of memory cells. However, if even one memory cell among the memory cells is defective, the semiconductor memory device cannot operate correctly.

As the degree of integration of semiconductor memory devices increases, the probability that defective memory cells exist becomes higher. Defective memory cells are one of the main causes of reducing the performance of semiconductor memory devices and deteriorating the yield of semiconductor memory devices. Therefore, redundancy circuit technology, which improves yield by replacing defective cells with redundant cells in a semiconductor memory device, is widely used.

In general, redundancy circuits drive redundancy memory cell blocks arranged in redundant rows and columns and select redundant cells in the redundancy memory cell blocks to replace the defective cells. Therefore, when an address signal for designating the defective cells is input, redundant memory cells are selected instead of the defective cells.

A method of replacing defective cells with redundant cells has been disclosed in U.S Pat. No. 5,325,334.

According to this Patent, a plurality of fuses within a fuse box array are programmed so as to be selectively cut or burnt in response to a defective column address signal. A plurality of fuse boxes are arranged in the fuse box array to repair a plurality of defective columns. Each of the fuse boxes shares column address signals corresponding to a defective column, and includes a plurality of fuses which are selectively programmed in response to a corresponding defective column address signal. Thus, if column address signals corresponding to a defective column are input to a fuse box, a redundancy column driver gate is driven in response to a first output signal provided by a block selection control circuit to select a predetermined redundancy column. The selected redundancy column replaces the defective column. In this way, defective cells are replaced by redundancy cells.

The semiconductor memory device is packaged after repairing the defective cells by the method provided in the U.S. Pat. No. 5,325,334, then tested. Since defective cells are replaced by redundant cells, normally, defective cells are not found during testing. However, defective memory cells known as progressive defect cells may be found during testing. Progressive defect occurs in a main memory cell block and a redundancy memory block. It is possible to enhance testing using various test patterns in order to stop the progressive defect at an early stage. By doing so, it is possible to make the test results correct. However, costs are increased since it takes longer to perform the test. Therefore, the number of test patterns is restricted to an appropriate level. It is necessary to determine whether the progressive defect, which occurs after the test, exists in the main memory cell block or the redundancy memory cell block and to feed back the determination result to a process engineer. Then, the process engineer takes a series of measures such as controlling process defects. However, it is difficult to determine the locations of the progressive defective cells by the conventional redundancy method including the method provided in U.S. Pat. No. 5,325,334.

Therefore, a semiconductor memory device capable of easily determining the locations of the progressive defective cells generated after the test of the semiconductor memory device where the defective cells are replaced by the redundant cells, is required.

SUMMARY OF THE INVENTION

It is an object of the present invention to provide a semiconductor memory device capable of easily determining whether defective memory cells are located in a main memory block or in a redundancy block by selectively isolating and testing a redundancy block even after packaging the semiconductor memory device.

Accordingly, to achieve the above object, there is provided a semiconductor memory device having a redundancy memory cell block for replacing defective cells by redundant memory cells in order to repair the defective cells in a main memory cell block, wherein a normal mode test for testing the main memory cell block and the redundancy memory cell block and a redundancy isolation mode test for selectively isolating and testing the redundancy memory cell block are adopted, and it is determined whether the defective memory cells found by the normal mode test are located in the main memory block or in the redundancy memory cell block by the redundancy isolation mode test.

According to an embodiment of the present invention, there is provided a semiconductor memory device having a redundancy memory cell block for replacing defective cells by redundant memory cells in order to repair the defective cells in a main memory cell block, comprising a row redundancy selection signal generating circuit for generating a row redundancy selection signal for replacing defective rows including the defective cells by redundancy rows in the redundancy memory cell block, a column redundancy selection signal generating circuit for generating a column redundancy selection signal for replacing defective columns including the defective cells by redundant columns in the redundancy memory cell block, and a redundancy block isolation signal generating circuit for generating a redundancy block isolation signal for isolating the redundancy memory cell block by disabling the row redundancy selection signal and the column redundancy selection signal. In the semiconductor memory device, it is determined whether the defective memory cells found by the normal mode test are located in the main memory block or in the redundancy memory cell block by the redundancy isolation mode test since the redundancy memory cell block is isolated during the test of the semiconductor memory device.

According to the present invention, it is possible to easily determine where defective memory cells are located by generating a redundancy block isolation signal according to a predetermined address and command provided from the outside after packaging chips and selectively isolating and testing the redundancy memory cell array block using the redundancy block isolation signal.

BRIEF DESCRIPTION OF THE DRAWING(S)

The above object and advantages of the present invention will become more apparent by describing in detail a preferred embodiment thereof with reference to the attached drawings in which:

FIG. 1 schematically shows a semiconductor memory device for isolating the operation of a redundancy memory cell block using a redundancy block isolation signal PRED-OFF according to an embodiment of the present invention;

DESCRIPTION OF THE PREFERRED EMBODIMENTS

Figure 1:
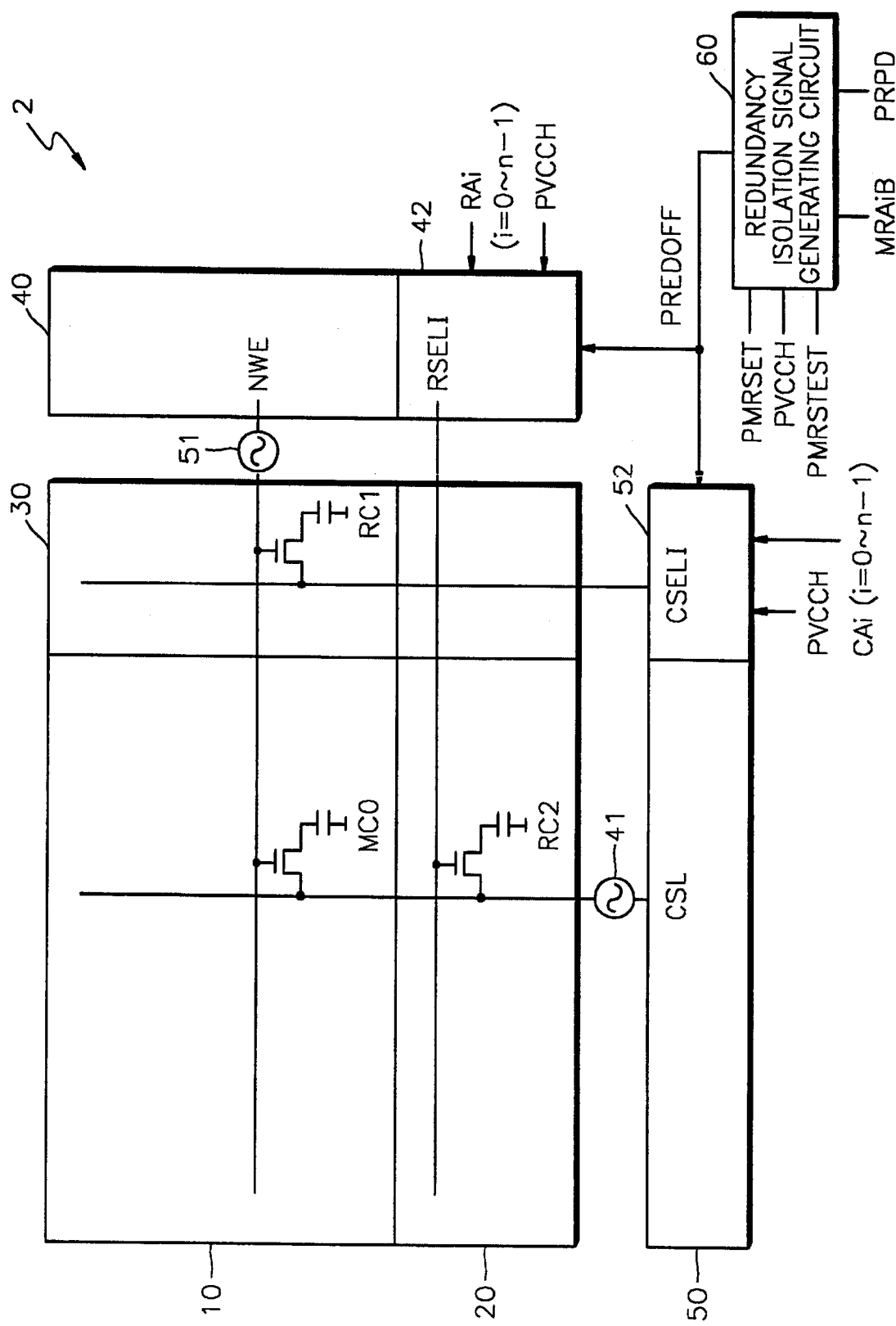

The present invention will be described in detail by describing the exemplary embodiment of the present invention with reference to the attached drawings. In the respective drawings, the same reference numerals denote the same elements. In the present specification, a synchronous DRAM including a plurality of redundant cells in order to repair defective cells in a memory block having a plurality of memory cells is taken as an example.

FIG. 1 shows a semiconductor memory device for blocking the operation of a redundancy memory cell block using a redundancy block isolation signal PREDOFF. Referring to FIG. 1, a semiconductor memory device 2 includes a main memory cell array block 10, a row redundancy cell array block 20, a column redundancy cell array block 30, a row decoder 40, a row redundancy selection signal generating circuit 42, a column decoder 50, a column redundancy selection signal generating circuit 52, and a redundancy block isolation signal generating circuit 60.

The main memory cell array block 10 consists of a plurality of memory cells MC0 arranged in rows and columns. In the row redundancy cell array block 20 and the column redundancy cell array block 30, redundant memory cells RC1 and RC2 are arranged in rows and columns in order to repair defective cells when defects exist in the memory cell MC0 in the main memory cell array block 10, namely, when defective cells exist. The number of redundant memory cells can vary in order to increase the repair efficiency of the defective cells.

The row decoder 40 decodes row addresses RAi (I=0 through n−1) input to the semiconductor memory device 2 and addresses the wordline of the memory cell MC0 in the main memory cell array block 10. The column decoder 50 decodes column addresses CAi (I=0 through n−1) input to the semiconductor memory device 2 and generates a main column selection signal CSL for selecting the bitline of the memory cell MC0 in the main memory cell array block 10.

Here, when defective cells exist in the main memory cell array block 10, rows and/or columns connected to the defective cells are called defective rows and/or columns. In order to replace the defective cells by the redundant memory cells, fuses 51 and 41 connected to the defective rows and/or columns are cut. Then, a normal path connected to the defective cells MC0 is cut. Therefore, the defective cells are no longer selected.

The row redundancy selection signal generating circuit 42 and the column redundancy selection signal generating circuit 52 select redundant row or redundant columns corresponding to the defective rows or the defective columns, which will be described in detail in relation to the redundancy isolation signal generating circuit 60 described hereinafter.

The redundancy block isolation signal generating circuit 60 generates a redundancy block isolation signal PREDOFF in response to a test mode address MRAiB, a test mode address control signal PRPD, a power-up signal PVCCH, and a normal test mode signal PMRSET. The test mode address MRAiB is one address selected from among predetermined addresses which is received from the outside and designated to isolate the redundancy memory cell array blocks 20 and 30 during testing. The test mode address control signal PRPD has a predetermined pulse width, which is set by a test command applied from the outside. A power-up signal PVCCH indicates the state of power supply for operating the semiconductor memory device 2. The normal test mode signal PMRSET directs a normal test of the main memory cell array block 10, the row redundancy memory cell array block 20, and the column redundancy cell array block 30. The redundancy block isolation mode signal PMRSTEST indicates that only the main memory cell array block 10 is tested.

The normal test mode signal PMRSET and the redundancy block isolation mode signal PMRSTEST are selectively activated in response to bit signals, for example, test mode addresses MRAiB stored in a mode register which specifies the operation of the synchronous DRAM during testing, a master mode register command signal, and a data rate signal for indicating a single data rate or a double date rate. Therefore, the entry into the normal mode test by the normal test mode signal PMRSET and the entry into the redundancy block isolation mode test by the redundancy block isolation mode signal PMRSTEST, are easily started by the bit signals of the mode register. Therefore, the normal mode test and the redundancy block isolation mode test are easily realized even after packaging the semiconductor memory device. The redundancy block isolation signal generating circuit 60 is shown in FIG. 2.

Figure 2:
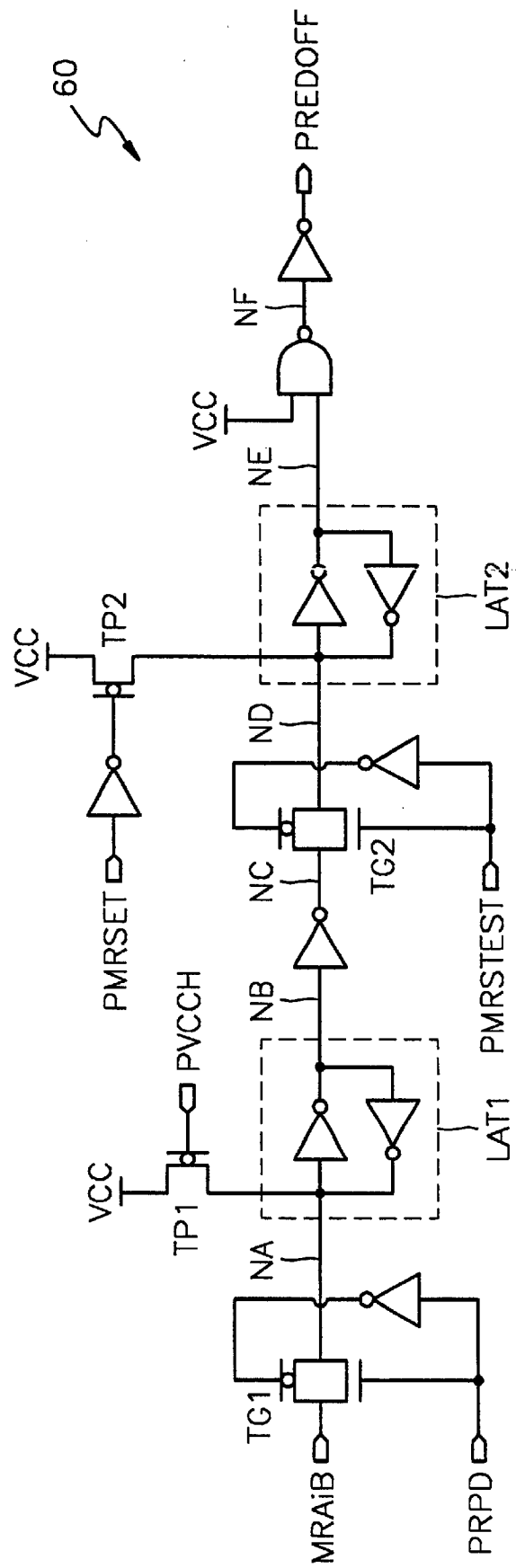
FIG. 2 shows the redundancy block isolation signal generating circuit of FIG. 1.

Referring to FIG. 2, in the redundancy block isolation signal generating circuit 60, a transistor TP2 is turned on in response to the logic high level of the normal test mode signal PMRSET. Accordingly, a node ND is transited to the logic high level. The logic high level of the node ND is maintained by a latch LAT2. Then, the redundancy block isolation signal PREDOFF is transited to a logic low level. The redundancy block isolation signal PREDOFF of the logic low level enables the row redundancy selection signal generating circuit 42 and the column redundancy selection signal generating circuit 52 to be described hereinafter and allows the redundant rows or the redundant columns corresponding to the defective rows or the defective columns to be selected.

The operation of the redundancy block isolation signal generating circuit 60 when the normal test mode signal PMRSET is at the logic low level is as follows. First, when a supply voltage Vcc is applied initially, the power-up signal PVCCH, the level of which depends on the applied supply voltage, is at the logic low level. When the level of the supply voltage Vcc is greater than or equal to a predetermined voltage level, the power-up signal PVCCH is transited to the logic high level.

Since the level of the supply voltage Vcc in the semiconductor memory device (2 of FIG. 1) is at a rising period while the power-up signal PVCCH is at the logic low level, which is an initial value, the supply voltage Vcc is unstable. Accordingly, the redundancy block isolation signal generating circuit 60 cannot perform a normal operation.

Then, a transistor TP1 is turned off in response to a transition to the logic high level of the power-up signal PVCCH. The test mode address MRAiB of the logic low level received after the test mode command, is transmitted to a node NA through a transmission gate TG1 which responds to the test mode address control signal PRPD of the logic high level. The logic low level of the node NA is maintained by a latch LAT1 and causes a node NB and a node NC to be transited to the logic high level and the logic low level, respectively. The logic low level of the node NC is transmitted to the node ND through the transmission gate TG2 which responds to the redundancy block isolation mode signal PMRSTEST of the logic high level. At this time, the transistor TP2 is turned off in response to the transition of the normal test mode signal PMRSET to the logic low level. The logic low level of the node ND is maintained by the latch LAT2 and causes a node NE and a node NF to be transited to the logic high level and the logic low level, respectively. Finally, the redundancy block isolation signal PREDOFF is transited to the logic high level. The redundancy block isolation signal PREDOFF of the logic high level is provided to the row redundancy selection signal generating circuit 42 and the column redundancy selection signal generating circuit 52 to be described hereinafter, and isolates the operations of the row redundancy selection signal generating circuit 42 and the column redundancy selection signal generating circuit 52.

Figure 3:
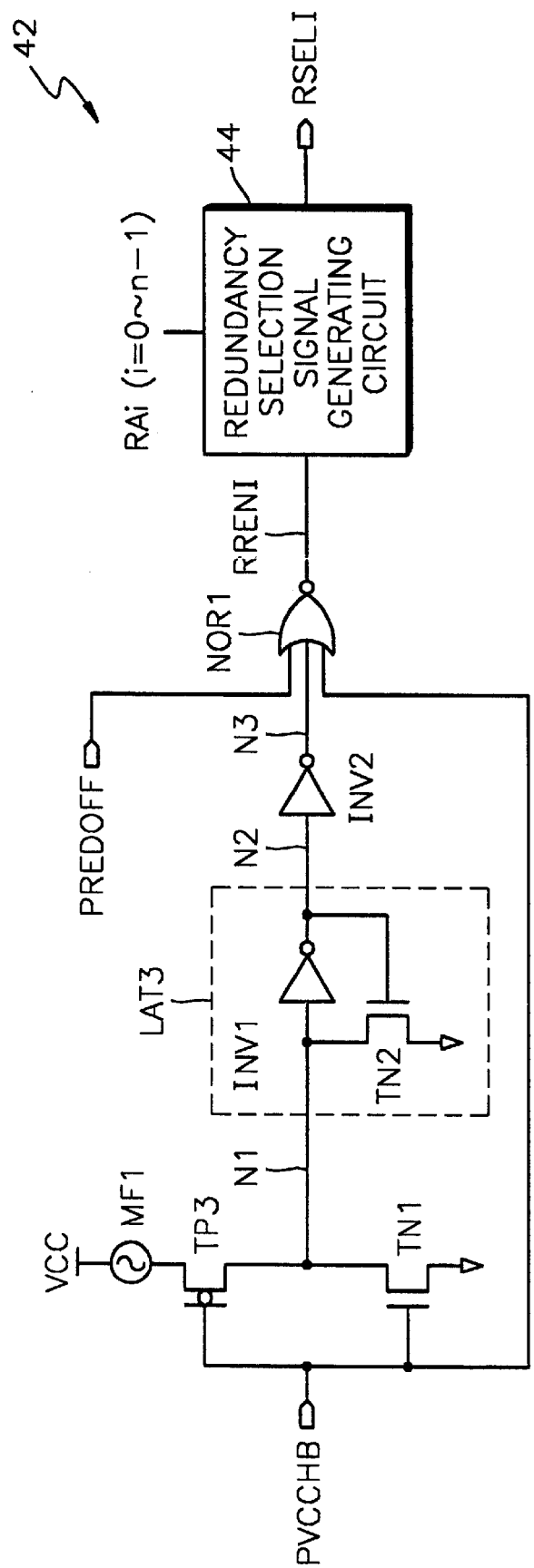
FIG. 3 shows the row redundancy selection signal generating circuit of FIG. 1.

FIG. 3 shows the row redundancy selection signal generating circuit of FIG. 1. Referring to FIG. 3, the row redundancy selection signal generating circuit 42 generates a row redundancy enable signal RRENI and a row redundancy selection signal RSELI in response to an inverted power-up signal PVCCHB and the redundancy block isolation signal PREDOFF. The row redundancy selection signal RSELI is generated in a redundancy selection signal generating circuit 44. The row redundancy selection signal RSELI replaces the defective rows by the redundant rows. The row redundancy enable signal RRENI and addresses RAI designate the defective rows. The inverted power-up signal PVCCHB has an inverted logic level of the power-up signal PVCCH.

In the row redundancy selection signal generating circuit 42, an NMOS transistor TN1, which responds to the logic high level of the inverted power-up signal PVCCHB, is turned on. Accordingly, a node N1 is initialized to the logic low level, i.e., the ground voltage. Then, a PMOS transistor TP3, which responds to the logic low level of the inverted power-up signal. PVCCHB, is turned on. Accordingly, the node N1 is transited to the logic high level, i.e., the supply voltage level, through a main fuse MF1. The logic high level of the node N1 is maintained by a latch LAT3 consisting of an inverter INV1 and an NMOS transistor TN2 and a node N2 is transited to the logic low level. The logic low level of the node N2 causes a node N3 to be transited to the logic high level through an inverter INV2. The row redundancy enable signal RRENI, the output of a 2-input NOR gate NOR1, which directly responds to the transition of the node N3 to the logic high level, is transited to the logic low level and blocks the operation of the selection signal generating circuit 44 to be described hereinafter. This means that the main memory cell array block (10 of FIG. 1) does not need to be replaced by the row redundancy cell array block (20 of FIG. 1) through the row redundancy selection signal generating circuit 42, since there are no defective rows.

When defective rows exist in the main memory cell array block (10 of FIG. 1), a main fuse MF1 is cut before a redundancy enable operation for replacing the defective rows with redundant rows. Accordingly, the node N1 is separated from the supply voltage Vcc. When the supply voltage Vcc is applied and the power-up signal PVCCHB is transited to the logic high level, the node N1 is initialized to the logic low level. When the power-up signal PVCCHB is transited to the logic low level, the NMOS transistor TN1 is turned off and the PMOS transistor TP3 is turned on. However, the supply voltage Vcc is no longer provided to the node N1 due to the cut main fuse MF1. Therefore, the initial logic low level of the node N1 is maintained by the latch LAT3 and the nodes N2 and N3 are transited to the logic high level and the logic low level, respectively. Since the node N3 and the inverted power-up signal PVCCHB are at the logic low level, the logic level of the row redundancy enable signal RRENI, which is the output of the 2-input NOR gate NOR1, is determined by the redundancy block isolation signal PREDOFF. Namely, the row redundancy enable signal RRENI is transited to the logic high level in response to the logic low level of the redundancy block isolation signal PREDOFF. Conversely, the row redundancy enable signal RRENI is transited to the logic low level in response to the logic high level of the redundancy block isolation signal PREDOFF. Meanwhile, the logic low level of the redundancy enable signal RRENI blocks the operation of the redundancy selection signal generating circuit 44, and the logic high level of the row redundancy enable signal RRENI activates the operation of the redundancy selection signal generating circuit 44.

The redundancy selection signal generating circuit 44 generates a row redundancy selection signal RSELI for selecting the redundant rows instead of the defective rows. The redundancy selection signal generating circuit 44 is shown in FIG. 4.

Figure 4:
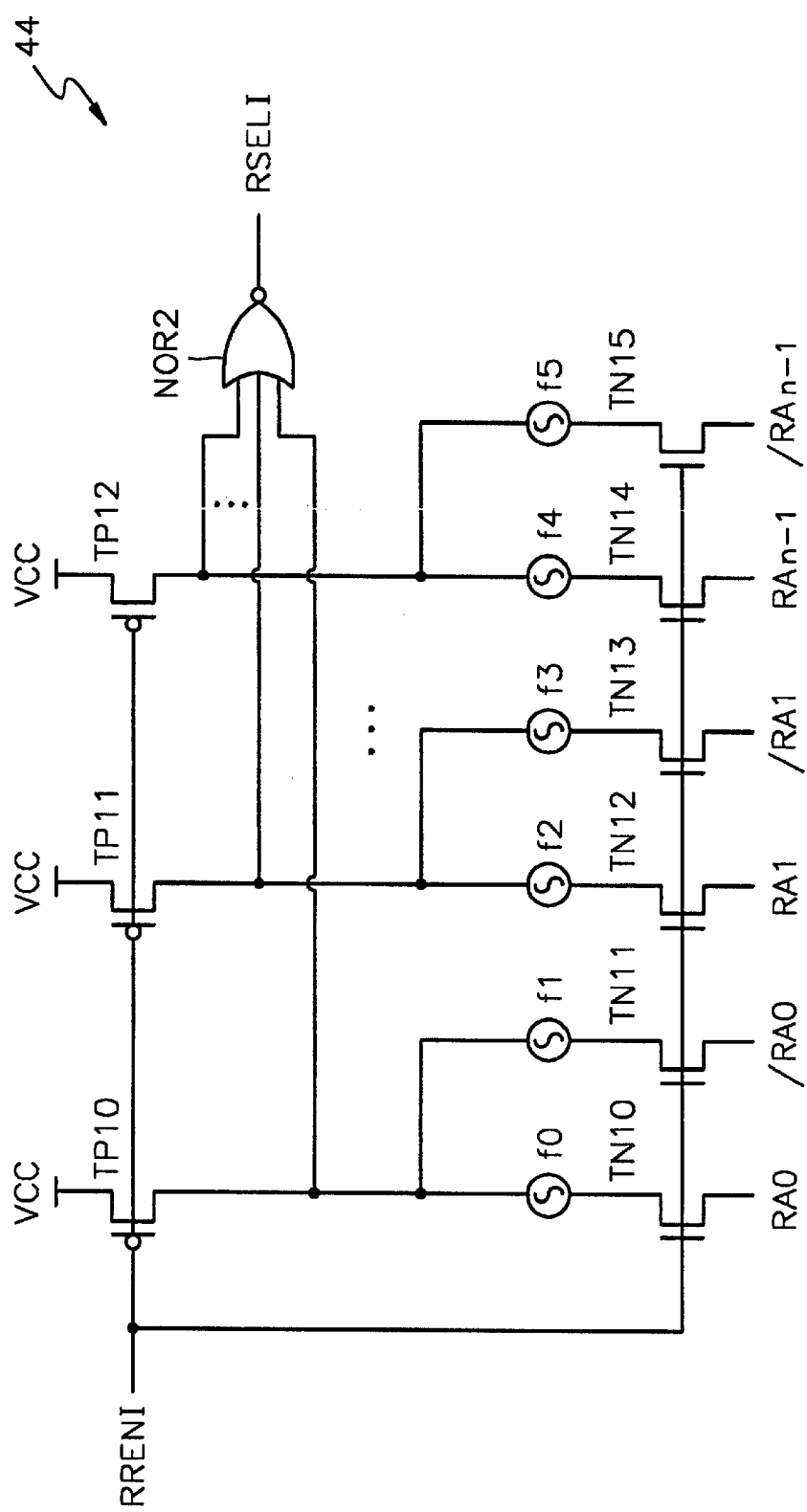
FIG. 4 shows the redundancy selection signal generating circuit of FIG. 3.

Referring to FIG. 4, the redundancy selection signal generating circuit 44 includes PMOS transistors TP10, TP11, and TP12, NMOS transistors TN10, TN11, and TN12, and a plurality of fuses f0, f1, and f2. The row redundancy enable signal RRENI is connected to gates of the PMOS transistors TP10, TP11, and TP12 and the NMOS transistors TN10, TN11, and TN12. The fuses f0, f1, and f2 are selectively cut according to address signals RAi (I=0 through n−1) connected to the NMOS transistors TN10, TN11, and TN12 for indicating the defective rows.

In the redundancy selection signal generating circuit 44, the fuses f0, f1, and f2 are selectively cut before the redundancy enable operation like the main fuse MF1 in the row redundancy selection signal generating circuit 42 of FIG. 3. When the redundancy enable signal RRENI is activated to the logic high level, the PMOS transistors TP10, TP11, and TP12 are turned off and the NMOS transistors TN10, TN11, TN12, TN13, TN14, and TN15 are turned on. Accordingly, the address signals RAi (I=0 through n−1) are provided to the fuses f0, f1, f2, f3, f4, and f5. At this time, the fuses f0, f1, f2, f3, f4, and f5 corresponding to high-level address signals among the address signals RAi and IRAi (I=0 through n−1) are cut. The logic high level address signal among the address signals RAi and IRAi (I=0 through n−1) are not transmitted by the cut fuses f0, f1, f2, f3, f4, and f5 and only logic low address signals RAi and /RAi (I=0 through n−1) level are input to a NOR gate NOR2. Accordingly, the row redundancy selection signal RSELI is transited to the logic high level. The row redundancy selection signal RSELI of the logic high level selects redundant rows corresponding to the defective rows.

Conversely, when the redundancy enable signal RRENI is at the logic low level, in the redundancy selection signal generating circuit 44, the NMOS transistors TN10, TN11, TN12, TN13, TN14, and TN15 are turned off and the address signals RAi and IRAi (I=0 through n−1) are not supplied to the fuses f0, f1, f2, f3, f4, and f5. The PMOS transistors TP10, TP11, and TP12 are turned on, and the supply voltage Vcc level is input to the NOR gate NOR2. Accordingly, the row redundancy selection signal RSELI is transited to the logic low level. The row redundancy selection signals RSELI of the logic low level do not select the redundant rows.

Figure 5:
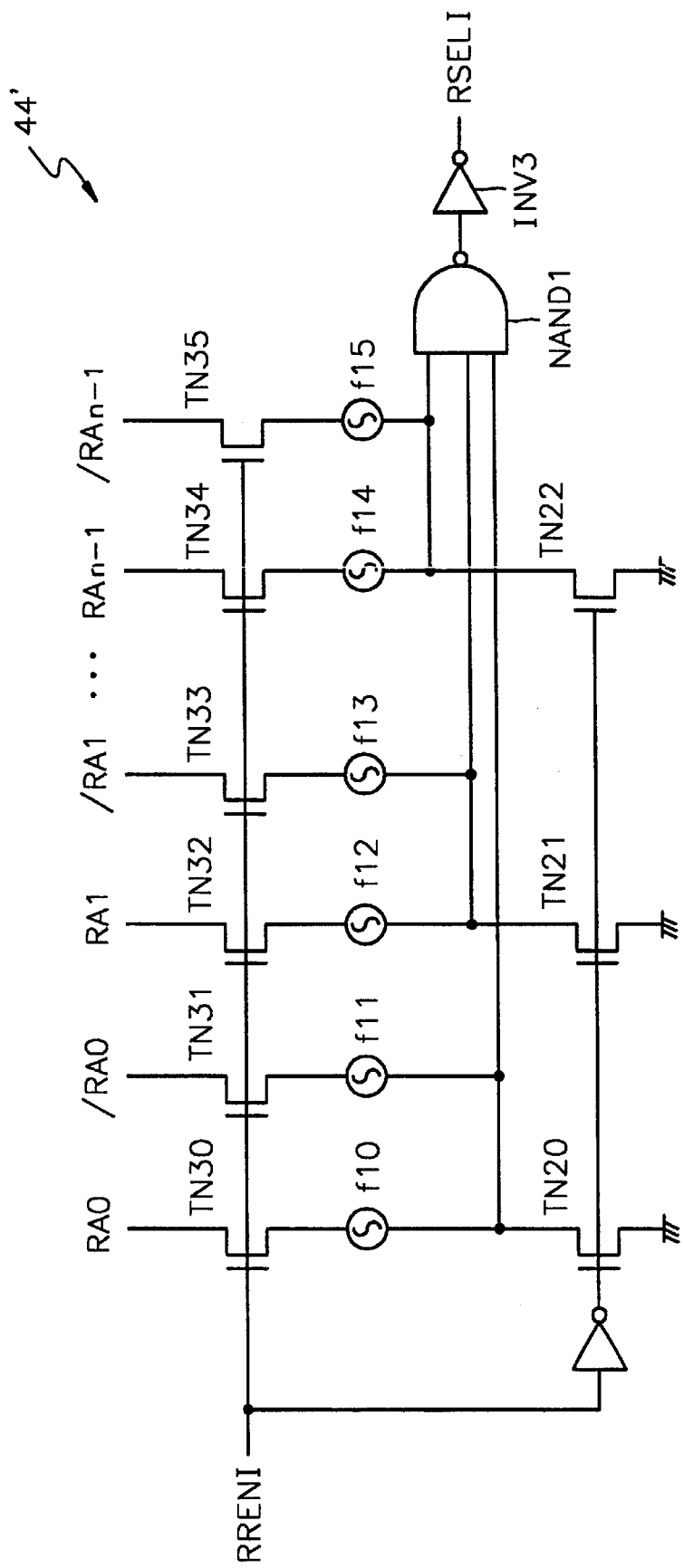
FIG. 5 shows another redundancy selection signal generating circuit of FIG. 1.

FIG. 5 shows another redundancy selection signal generating circuit of FIG. 1. Referring to FIG. 5, the redundancy selection signal generating circuit 44' includes the first NMOS transistors TN30, TN31, TN32, TN33, TN34, and TN35 and the second NMOS transistors TN20, TN21, and TN22. The first NMOS transistors TN30, TN31, TN32, TN33, TN34, and TN35 are connected between address signals RAi and /RAi (I=0 through n−1) and fuses f10, f11, f12, f13, f14, and f15, respectively, and transmit the address signals RAi and IRAi (I=0 through n−1) to the fuses f10, f11, f12, f13, f1, and f15 in response to the row redundancy enable signal RRENI. The second NMOS transistors TN20, TN21, and TN22 are connected to a pair of fuses f10, f11, f12, f13, f14, and f15, respectively. The second NMOS transistors TN20, TN21, and TN22 initialize the row redundancy selection signal RSELI in response to the inverted row redundancy enable signal RRENI. The fuses f10, f11, f12, f13, f14, and f15 are selectively cut according to the logic level of the address signals RAi and /RAi (I=0 through n−1).

The fuses f10, f11, f12, f13, f14, and f15 are selectively cut before the redundancy enable operation. Namely, the fuses f10, f11, f12, f13, f14, and f15 which are connected to a logic high level address signals among the address signals RAi and /RAi (I=0 through n−1) are cut. When the redundancy enable signal RRENI is at the logic low level, the second NMOS transistors TN20, TN21, and TN22 are turned on and the row redundancy selection signal RSELI is initialized to the logic low level. The row redundancy selection signals RSELI of the logic low level do not select the redundant rows.

When the redundancy enable signal RRENI goes to the logic high level, the second NMOS transistors TN20, TN21, and TN22 are turned off and the first NMOS transistors TN30, TN31, TN32, TN33, TN34, and TN35 are turned on. The logic low level address signals among the address signals RAi and /RAi (I=0 through n−1) are not transmitted by the cut fuses f10, f11, f12, f13, f14, and f15 and only the logic high level address signals RAi and IRAi (I=0 through n−1) are input to a NAND) gate NAND1. Accordingly; the row redundancy selection signal RSELI is transited to the logic high level. The row redundancy selection signal RSELI of the logic high level selects redundant rows corresponding to the defective rows.

Figure 6:
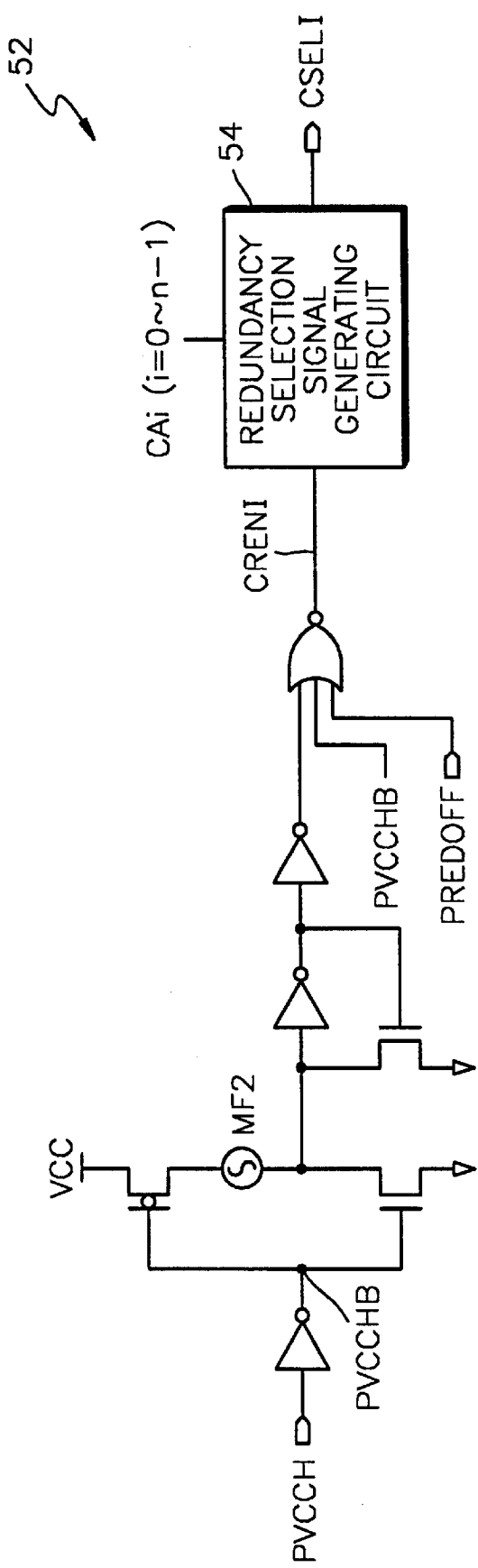
FIG. 6 shows the column redundancy selection signal generating circuit of FIG. 1.

FIG. 6 shows the column redundancy selection signal generating circuit of FIG. 1. Referring to FIG. 6, the operation of the column redundancy selection signal generating circuit 52 is almost the same as the operation of the row redundancy selection signal generating circuit 42 of FIG. 3. The difference between the operations of each lies in that addresses CAi (I=0 through n−1) for designating the defective columns are input to the redundancy selection signal generating circuit 54 of FIG. 5 and that addresses for designating the defective rows are input to the redundancy selection signal generating circuit 44 of FIG. 3. Therefore, a detailed description of the operation of the column redundancy selection signal generating circuit 52 will be omitted.

In the column redundancy selection signal generating circuit 52, a main fuse MF2 and fuses (not shown) connected to the addresses CAi (I=0 through n−1) for designating the defective columns, are cut before the redundancy enable operation for replacing defective columns with redundant columns, when defective columns exist in the main memory cell array (10 of FIG. 1). Then, the column redundancy selection signal generating circuit 52 generates the column redundancy enable signal CRENI of the logic high level in response to the power-up signal PVCCH of the logic high level, the inverted power-up signal PVCCHB of the logic low level, and the redundancy block isolation signal PREDOFF of the logic low level, in a state where the main fuse MF2 is cut. The column redundancy selection signal generating circuit 52 generates the column redundancy selection signal CSELI of the logic high level in response to the column redundancy enable signal CRENI of the logic high level, according to the state of fuses (not shown) in the redundancy selection signal generating circuit 54, and selects redundant columns corresponding to the defective columns.

Figure 7:
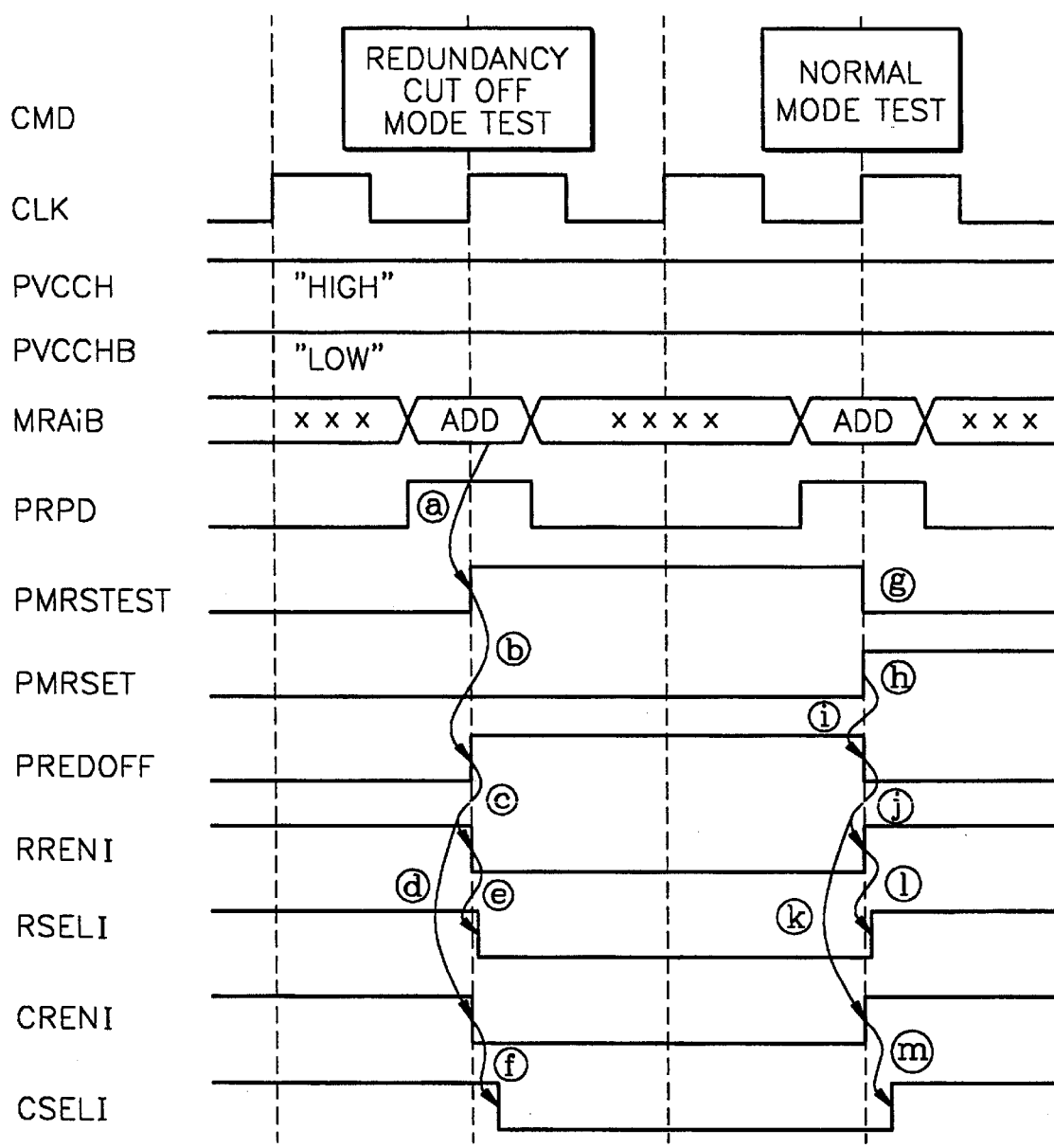
FIG. 7 is a timing diagram showing the operation of the semiconductor memory device of FIG. 1.

The operation of the semiconductor memory device 2 will now be described with reference to the timing diagram of FIG. 7, and FIG. 1.

When a test command CMD for instructing the test of the semiconductor memory device 2 is received by the semiconductor memory device 2, the test command CMD is synchronized with a clock signal CLK and operations corresponding to the test command CMD are performed. When the supply voltage Vcc is applied to the semiconductor memory device 2, the power-up signal PVCCH is continuously at the logic high level and the inverted power-up signal PVCCHB is continuously at the logic low level.

A command for instructing to perform a test in a redundancy block isolation mode will now be described. A test mode address MRAiB is input while a test mode address control signal PRPD is at a predetermined logic high level pulse width according to the test command CMD for instructing to perform a test in the redundancy block isolation mode. The redundancy block isolation mode tests only the main memory cell array block 10. In the redundancy block isolation mode, the redundancy block isolation signal PREDOFF is transited to the logic high level (b) in response to the redundancy block isolation mode signal PMRSTEST of the logic high level. The row and column redundancy selection signal generating circuits 42 and 52, which respond to the redundancy block isolation signal PREDOFF of the logic high level, set the row redundancy enable signal RRENI and the column redundancy enable signal CRENI, respectively, to be at the logic low level □ and (d). The row redundancy enable signal RRENI of the logic low level and the column redundancy enable signal CRENI of the logic low level disable the row redundancy selection signal RSELI and the column redundancy selection signal CSELI, respectively, to be at the logic low level (e) and (f). Therefore, in the semiconductor memory device 2, the test of the row and column redundancy memory cell array blocks 20 and 30 is isolated by the row and column redundancy selection signals RSELI and CSELI of the logic low level, respectively, according to the command for instructing to perform a test in the redundancy block isolation mode.

When the defective cells are not found as a result of testing the semiconductor memory device again in the redundancy block isolation mode after the defective cells have been found by the normal mode test, it is easily noted that the defective cells found in the normal mode test do not exist in the main memory cell block but in the redundancy memory cell block.

Conversely, when the defective cells are found by testing the semiconductor memory device again in the redundancy block isolation mode after the defective cells have been found by the normal mode test, the number of defective cells found by testing the semiconductor memory device again in the redundancy block isolation mode can be less than or equal to the number of defective cells found by the normal mode test. When the number of defective cells found by testing the semiconductor memory device again in the redundancy block isolation mode is equal to the number of defective cells found by the normal mode test, it is easily noted that the defective cells found by the normal mode test are located in the main memory cell block. When the number of defective cells found by testing the semiconductor memory device in the redundancy block isolation mode is smaller than the number of defective cells found by the normal mode test, it is easily noted that the defective cells found by the normal mode test are located in the main memory cell block and the redundancy memory cell block.

The normal test mode of testing the row redundancy memory cell array block 20 and the column redundancy cell array block 30 will now be described. The redundancy block isolation mode signal PMRSTEST is deactivated to the logic low level by the command CMD for instructing to perform a test in the normal mode (g) and the normal test mode signal PMRSET is activated to the logic high level (h). The redundancy block isolation signal PREDOFF is deactivated to the logic low level by the normal test mode signal PMRSET of the logic high level (l). The redundancy block isolation signal PREDOFF of the logic low level enables the row redundancy enable signal RRENI and the column redundancy enable signal CRENI in the row and column redundancy selection signal generating circuits 42 and 52, respectively, to the logic high level (j) and (k). The row redundancy enable signal RRENI and the column redundancy enable signal CRENI of the logic high level activate the row redundancy selection signal RSELI and the column redundancy selection signal CSELI, respectively, to the logic high level so as to select the redundant rows or the redundant columns corresponding to the defective rows or the defective columns (l) and (m). Therefore, the semiconductor memory device 2 simultaneously tests the redundant cells in the row and column redundancy memory cell array blocks 20 and 30, which are selected by the row and column redundancy selection signals RSELI and CSELI of the logic high level, and the main memory cell array block 10, according to the command for indicating that testing is to be performed in the normal mode.

The remaining defective cells, excluding the defective cells which exist in the main memory cell array block 10 in response to the redundancy block isolation signal PREDOFF of the logic high level among the defective cells, exist in the row and column redundancy memory cell array blocks 20 and 30.

Therefore, according to the present invention, it is possible to easily determine the locations of the defective memory cells by selectively isolating and testing the redundancy memory cell array block using the redundancy block isolation signal PREDOFF. It is preferable that the present invention is used after packaging the semiconductor memory device.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A semiconductor memory device having a main memory cell block and a redundancy memory cell block that can be used to repair defective cells in the main memory cell block, wherein a normal mode test for testing both the main memory cell block and the redundancy memory cell block and a redundancy isolation mode test for selectively isolating the redundancy memory cell block while testing the main memory cell block are adopted, and based on the redundancy isolation mode test it is determined whether the defective memory cells originally identified by the normal mode test are located in the main memory cell block or in the redundancy memory cell block.

2. A semiconductor memory device having a redundancy memory cell block for replacing defective cells by redundant memory cells in order to repair the defective cells in a main memory cell block, comprising:

a row redundancy selection signal generating circuit for generating a row redundancy selection signal for replacing defective rows including the defective cells by redundancy rows in the redundancy memory cell block;

a column redundancy selection signal generating circuit for generating a column redundancy selection signal for replacing defective columns including the defective cells by redundant columns in the redundancy memory cell block; and a redundancy block isolation signal generating circuit for generating a redundancy block isolation signal for isolating the redundancy memory cell block by disabling the row redundancy selection signal and the column redundancy selection signal, wherein a normal mode test for testing the main memory cell block and the redundancy memory cell block, and a redundancy isolation mode test activated by the redundancy block isolation signal, are adopted during the test of the semiconductor memory device, and it is determined whether the defective memory cells found by the normal mode test are located in the main memory block or in the redundancy memory cell block by the redundancy isolation mode test.

3. The semiconductor memory device of claim 2, wherein the redundancy block isolation signal generating circuit selectively disables the row redundancy selection signal and the column redundancy selection signal, respectively.

4. The semiconductor memory device of claim 2, wherein the redundancy block isolation signal generating circuit activates the redundancy block isolation signal in response to a test mode address designated in order to isolate the redundancy memory cell array block during testing, the address being one selected among addresses received from the outside of the semiconductor memory device, and the redundancy block isolation mode signal indicative of testing of only the main memory cell array block.

5. The semiconductor memory device of claim 4, wherein the redundancy block isolation signal generating circuit receives the test mode address in response to a test mode address control signal having a predetermined pulse width according to a test command.

6. The semiconductor memory device of claim 2, wherein the redundancy block isolation signal generating circuit deactivates the redundancy block isolation signal in response to a normal mode test signal indicative of testing of the main memory cell array block and the redundancy memory cell array block.

7. The semiconductor memory device of claim 2, wherein each of the row and column redundancy selection signal generating circuits comprises a plurality of fuses coded corresponding to an address signal for designating the defective cells, and the row and column redundancy selection signal generating circuits repair the defective cells by generating the row and column redundancy selection signals corresponding to the defective cells.

8. The semiconductor memory device of claim 2, wherein the defective cells are no longer selected by cutting fuses in row and column decoders connected to the defective cells, thus isolating a normal path connected to the defective cells.

9. A method of testing a packaged integrated circuit memory device containing a main memory array and a redundant memory array therein, comprising the steps of:
   determining a first quantity of defective memory cells in the packaged integrated circuit memory array by performing a normal mode test on the main memory array and the redundant memory array; and
   determining a second quantity of defective memory cells in the packaged integrated circuit memory array by performing a redundancy isolation mode test on the packaged integrated circuit memory array while simultaneously selectively isolating the redundant memory array.

10. The method of claim 9, further comprising the step of:
    identifying the redundant memory array as defective if the first quantity is nonzero and the second quantity is zero, or identifying the main memory array as defective if the first quantity is nonzero and the second quantity equals the first quantity, or identifying both the main memory array and the redundant memory array as defective if the second quantity is nonzero and is unequal to the first quantity.

* * * * *